(12) United States Patent
Baumgartner et al.

(10) Patent No.: US 8,146,034 B2
(45) Date of Patent: Mar. 27, 2012

(54) EFFICIENT REDUNDANCY IDENTIFICATION, REDUNDANCY REMOVAL, AND SEQUENTIAL EQUIVALENCE CHECKING WITHIN DESIGNS INCLUDING MEMORY ARRAYS.

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 12/771,677

(22) Filed: Apr. 30, 2010

(65) Prior Publication Data
US 2011/0271242 A1 Nov. 3, 2011

(51) Int. Cl.
*G06F 17/50* (2006.01)
(52) U.S. Cl. ...................................... 716/107
(58) Field of Classification Search .................... 716/107
See application file for complete search history.

(56) References Cited

U.S. PATENT DOCUMENTS

| | | | |
|---|---|---|---|
| 5,255,239 A * | 10/1993 | Taborn et al. ................. | 365/221 |
| 5,377,123 A | 12/1994 | Hyman | |
| 5,644,498 A | 7/1997 | Joly et al. | |
| 5,708,612 A | 1/1998 | Abe | |
| 5,818,726 A | 10/1998 | Lee | |
| 5,953,283 A | 9/1999 | Meltzer et al. | |
| 6,374,205 B1 | 4/2002 | Kuribayashi et al. | |
| 6,374,390 B1 | 4/2002 | Quarles et al. | |
| 6,378,112 B1 | 4/2002 | Martin et al. | |
| 6,425,116 B1 | 7/2002 | Duboc et al. | |
| 6,449,747 B2 | 9/2002 | Wuytack et al. | |
| 6,532,440 B1 | 3/2003 | Boppana et al. | |
| 6,611,952 B1 | 8/2003 | Prakash et al. | |
| 6,636,939 B1 | 10/2003 | George | |
| 9,800,362 | 2/2004 | Baumgartner et al. | |
| 6,717,884 B2 | 4/2004 | Kim | |

(Continued)

FOREIGN PATENT DOCUMENTS

EP 1770495 A1 4/2007

(Continued)

OTHER PUBLICATIONS

USPTO U.S. Appl. No. 12/771,404, 1 page.

(Continued)

*Primary Examiner* — Jack Chiang
*Assistant Examiner* — Brandon Bowers
(74) *Attorney, Agent, or Firm* — Stephen R. Tkacs; Stephen J. Walder, Jr.; Diana R. Gerhardt

(57) ABSTRACT

A mechanism is provided for efficient redundancy identification, redundancy removal, and sequential equivalence checking with designs including memory arrays. The mechanism includes an array merging component to optimally merge an array output such that if the address is out-of-bounds or the port is not asserted, the array output is converted to a random output. The mechanism also includes a component for determining the equivalence of enabled array outputs rather than the array outputs directly and creating an enabled array output. The mechanism also includes a component that precludes potentially-redundant array cells from participating in the sequential redundancy removal determination. This component first checks for compatibility of the corresponding arrays, then the corresponding read port enables and addresses, then the corresponding initial values, and finally checking that writes to the corresponding columns yield a compatible set of values.

20 Claims, 7 Drawing Sheets

U.S. PATENT DOCUMENTS

| | | | |
|---|---|---|---|
| 6,748,573 B2 | 6/2004 | Baumgartner et al. | |
| 6,763,505 B2 | 7/2004 | Baumgartner et al. | |
| 6,847,927 B2 | 1/2005 | Hoffman et al. | |
| 7,006,370 B1 | 2/2006 | Ramesh et al. | |
| 7,069,523 B2 | 6/2006 | Nation et al. | |
| 7,194,724 B2 | 3/2007 | Hattori et al. | |
| 7,260,799 B2 | 8/2007 | Baumgartner et al. | |
| 7,299,432 B2 | 11/2007 | Baumgartner et al. | |
| 7,367,002 B2 | 4/2008 | Baumgartner et al. | |
| 7,386,818 B2 | 6/2008 | Ganai et al. | |
| 7,398,484 B2 | 7/2008 | Ruf | |
| 7,448,005 B2 | 11/2008 | Baumgartner et al. | |
| 7,506,297 B2 | 3/2009 | Mukherjee et al. | |
| 7,512,925 B2 | 3/2009 | Birmiwal et al. | |
| 7,523,380 B1 * | 4/2009 | Trimberger | 714/763 |
| 7,962,880 B2 * | 6/2011 | Lipetz et al. | 716/126 |
| 8,001,498 B2 | 8/2011 | Bjesse | |
| 2001/0052106 A1 | 12/2001 | Wuytack et al. | |
| 2003/0065965 A1 | 4/2003 | Korobkov | |
| 2003/0123319 A1 | 7/2003 | Kim | |
| 2004/0039893 A1 | 2/2004 | Lyon | |
| 2004/0117744 A1 | 6/2004 | Nation et al. | |
| 2005/0091475 A1 | 4/2005 | Sodani | |
| 2006/0136849 A1 | 6/2006 | Greenberg et al. | |
| 2007/0067746 A1 | 3/2007 | Baumgartner et al. | |
| 2007/0121499 A1 | 5/2007 | Pal et al. | |
| 2008/0066034 A1 | 3/2008 | Baumgartner et al. | |
| 2008/0120085 A1 | 5/2008 | Alexanian et al. | |
| 2008/0134114 A1 | 6/2008 | Bjesse et al. | |
| 2008/0144421 A1 | 6/2008 | Deng et al. | |
| 2009/0013301 A1 | 1/2009 | Ogilvie et al. | |
| 2009/0144674 A1 | 6/2009 | Koithyar et al. | |
| 2009/0190386 A1 | 7/2009 | Ki Kim | |
| 2009/0228848 A1 | 9/2009 | Kumazaki | |
| 2010/0020605 A1 | 1/2010 | Aritome | |
| 2010/0097837 A1 | 4/2010 | Paul | |
| 2010/0107132 A1 | 4/2010 | Bjesse | |
| 2010/0293513 A1 | 11/2010 | Baumgartner et al. | |
| 2011/0066578 A1 | 3/2011 | Chong et al. | |
| 2011/0145780 A1 | 6/2011 | Chen | |
| 2011/0270597 A1 | 11/2011 | Baumgartner et al. | |
| 2011/0271243 A1 | 11/2011 | Baumgartner et al. | |
| 2011/0271244 A1 | 11/2011 | Baumgartner et al. | |
| 2011/0276930 A1 | 11/2011 | Baumgartner et al. | |
| 2011/0276931 A1 | 11/2011 | Baumgartner et al. | |
| 2011/0276932 A1 | 11/2011 | Baumgartner et al. | |

FOREIGN PATENT DOCUMENTS

| | | |
|---|---|---|
| JP | 06162139 A2 | 6/1994 |
| JP | 09035497 A | 2/1997 |
| JP | 2008541331 | 11/2008 |

OTHER PUBLICATIONS

USPTO U.S. Appl. No. 12/771,479, 1 page.
USPTO U.S. Appl. No. 12/771,613, 1 page.
USPTO U.S. Appl. No. 12/775,607, 1 page.
USPTO U.S. Appl. No. 12/775,622, 1 page.
USPTO U.S. Appl. No. 12/775,633, 1 page.
Bardell, PH et al., "Random Pattern Testability of the Logic Surrounding Memory Arrays", IBM technical Disclosure Bulletin, IPCOM000039582D, Jul. 1987, pp. 521-528.
Baumgartner, J et al., "Maximal Input Reduction of Sequential Netlists via Synergistic Repararneterization and Localization Strategies", Correct Hardware Design and Verification Methods, 13th IFIP WG 10.5 Advanced Research Working Conference, CHARME 2005, Proceedings 3-6, Saarbrucken, Germany, Oct. 2005, 1 page.
Burch, Jerry R. et al., "Automatic Verification of Pipelined Microprocessor Control", Lecture Notes in Computer Science, vol. 818, Proceedings of the 6th International Conference on Computer Aided Verification, Year of Publication: 1994, pp. 68-80.
Pandey, M et al., "Formal Verification of Memory Arrays Using Symbolic Trajectory Evaluation", IEEE International Workshop on Memory Technology, Design and Testing (MTDT 1997), pp. 42.
Ray, Sandip et al., "Abstracting and Verifying Flash Memories", http://userweb.cs.utexas.edu/~sandip/publications/flash-nvm-08/flash.pdf, <retrieved on Mar. 10, 2010>, 5 pages.
Velev, Miroslav et al., "Efficient Modeling of Memory Arrays in Symbolic Simulation", Computer Aided Verification, vol. 1254/1997, Jun. 1997, pp. 388-399.
Notice of Allowance mailed Jan. 12, 2012 for U.S. Appl. No. 12/771,613; 11 pp.
Office Action mailed Oct. 24, 2011 for U.S. Appl. No. 12/775,633; 15 pp.
Office Action mailed Dec. 9, 2011 for U.S. Appl. No. 12/775,622; 11 pp.

* cited by examiner

FIG. 3

```
void merge_gate(gate g1, gate g2) {
  replace fanout references to "g1" by references to "g2"

convert "g1" from its existing type to "buffer"

disconnect fanin references from "g1" and add a fanin reference to "g2"
}
```

FIG. 5

```
void merge_arrayout(arrayout a1, gate g2) {
  oob = synthesis of "greater-than" comparison of a1.port.address(0 to p) vs its # rows randomized = oob OR NOT(a1.port.enable)

convert a1 from type "arrayout" to type "RANDOM" and dis-associate it from its array mux = if(randomized) then (a1) else (g2)

replace all fanout references to a1 by references to mux
}
```

FIG. 7

```
equiv_classes identify_redundancy(netlist N) {

1. Compute a set of suspected equivalent gates. The result is a set of equivalence classes,
where each pair of gates in an equivalence class is suspected to be functionally equivalent to
each other gate, along all possible traces.
  2. Speculatively reduce the netlist by replacing each fanout reference to a gate within an
equivalence class by a reference to a representative gate therein.
  3. Add a "miter" to validate each suspected equivalence, namely an exclusive-OR gate between
each gate in an equivalence class and its representative gate therein.
  4. Attempt to prove that each miter from Step 3 is semantically equivalent to 0.
  5. If any miter is asserted or otherwise unproven, refine the equivalence classes to separate the
corresponding gates; go to Step 2.
  6. Return accurate equivalence classes.
}
```

```
void create_enabled_arrayouts(gate normalized_value) {
  For each arrayout a_i to be potentially merged:
    oob_i = synthesis of greater-than comparison of a_i.port.address(0 to p) against top row index of a_i.array
    randomized_i = oob_i OR NOT(a_i.enable)
    mux_i = if NOT(randomized_i) then (a_i) else (normalized_value)
}
```

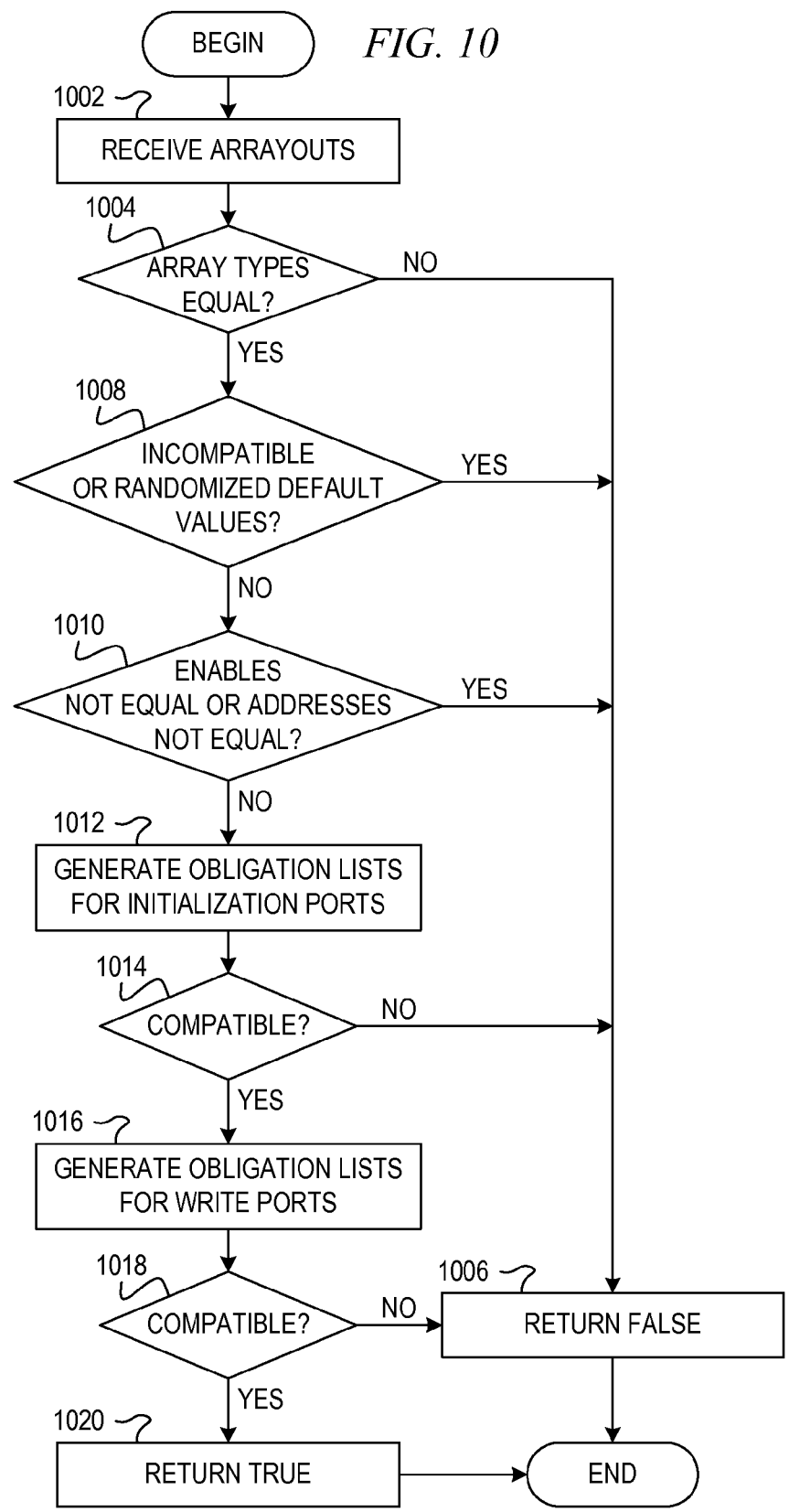

FIG. 11

```
bool arrayouts_are_equivalent(arrayout a_i, arrayout a_j) {
  if a_i.array.type != a_j.array.type, return false if a_i.array and a_j.array have incompatible default initial values with respect to a_i.column and
a_j.column respectively, or if that default initial value is "randomized", return false if ((a_i.enable != a_j.enable) or (a_i.port.address(0 to p) != a_j.port.address(0 to p))), return false if NOT(compatible_lists(generate_obligation_list(a_i, Init), generate_obligation_list(a_j, Init)))
return false instead of returning (mux_i XOR mux_j)==0 as with traditional equivalence checking, return
compatible_lists(generate_obligation_list(a_i, Write), generate_obligation_list(a_j, Write)
 } bool compatible_lists(list l_i, list l_j) {
   for each <updates_m, address_m, data_m> in (l_i)
     if(updates_m == TRUE) { check if exists <updates_n, address_n, data_n> in l_j such that
        <updates_n == TRUE, address_n(0 to p) == address_m(0 to p), data_n == data_m> if not, return false if exists <updates_n, address_n, data_n> in l_j such that (updates_n == TRUE) and this entry
was not matched in above loop, then false
    return true
  }

// note: T is either Init or Write
  list generate_obligation_list(arrayout a, port_type T) {
   list = NULL;
   for port T_i in (T_1,... , T_n) of a.array in order of decreasing precedence updates_i = FALSE if T_i.data(a.column) is disconnected else
      (a_i.port.enable AND (there is no port T_h for h<i for which T_h.data(a.column) is connected
      and T_i.address(0 to p) == T_h.address(0 to p)));

push list, <updates_i, T_i.address(0 to p), T_i.data(a.column)>
   return list;
}
```

EFFICIENT REDUNDANCY IDENTIFICATION, REDUNDANCY REMOVAL, AND SEQUENTIAL EQUIVALENCE CHECKING WITHIN DESIGNS INCLUDING MEMORY ARRAYS.

BACKGROUND

The present application relates generally to an improved data processing apparatus and method and more specifically to mechanisms for efficient redundancy identification, redundancy removal, and sequential equivalence checking within designs including memory arrays.

Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists. Unfortunately, formal verification techniques require computational resources that are exponential with respect to the size of the design under test. Semiformal verification techniques leverage formal algorithms to larger designs by applying them only in a resource-bounded manner, though at the expense of incomplete verification coverage.

U.S. Pat. No. 6,698,003 proposes the generic concept of "transformation-based verification" to enable the use of multiple algorithms, encapsulated as "engines" of a modular multiple-engine based verification system to synergistically simplify and decompose complex problems into simpler sub-problems that are easier to formally discharge. The transformation-based verification paradigm has demonstrated itself essential to enhance the scalability of formal verification algorithms to verification problems of industrial relevance, where it is often desired to leverage the bug-hunting power of formal methods to large units of logic that are the common focus of simulation-based test benches.

One large capacity gap between traditional formal verification algorithms vs. simulation-based testbenches is due to bit-blasting employed in the. In particular, virtually every industrial hardware formal verification tool "bit-blasts" design components into simpler primitives, such as two-input AND gates, inverters, and single-bit state elements. In contrast, logic simulators often support higher-level primitives without bit-blasting. One type of design component that often entails a dramatic bloat when bit-blasted is a memory array, which is a row-addressable, two-dimensional state element often used to represent main memory or caches. Such memory arrays may be extremely large when bit-blasted. Modern caches often are several megabytes, and if verifying a design component that interacts with main memory, it may even be required to support more than $2^{32}$ rows of arbitrary width. Bit-blasting of such large memory arrays often constitutes a fatal bottleneck to formal verification tools.

Logic designs used to represent hardware, software, or hybrid systems may be represented using a variety of formats. Example formats include hardware description languages (HDLs), higher-level languages such as SystemC, or lower-level formats such as netlists. There are numerous application domains in which it is advantageous to reduce the size of design representations. For example, logic synthesis and design aids often attempt to yield more compact representations that lend themselves to higher quality silicon or assembly code.

Verification frameworks, such as logic simulators and accelerators, often dramatically benefit in speed and capacity from techniques to reduce the size of the corresponding logic representation. Equivalence checking frameworks, pervasively used in the semiconductor industry to establish the behavioral equivalence of two versions of a design, often are critically sensitive to the ability to reduce the size of the composition of the two designs to adequately scale to the desired magnitude. Various design debug, visualization, and coverage analysis tools attempt to build more abstract views of a logic representation. These tools often represent memory arrays, which are common components in many types of logic designs, at quite a low level of abstraction. These tools represent custom logic design components including aspects, such as test and reliably features.

SUMMARY

In one illustrative embodiment, a method, in a data processing system, is provided for performing redundancy removal in an integrated circuit design with a memory array. The method comprises receiving, by the data processing system, a netlist for an integrated circuit design. The netlist comprises a memory array having one or more arrayouts. The method further comprises determining, by the data processing system, an equivalent class comprising a set of suspected equivalent gates. The set of suspected equivalent gates comprises a plurality of arrayouts. The method further comprises determining, by the data processing system, whether a first arrayout and a second gate in the equivalence class are equivalent and responsive to the first arrayout and the second gate being equivalent, merging, by the data processing system, the first arrayout and the second gate.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 3 depicts pseudo-code for the operations illustrated in FIG. 2 in accordance with an example embodiment;

FIG. 5 depicts pseudo-code for the operations illustrated in FIG. 4 in accordance with an example embodiment;

FIG. 7 depicts pseudo-code for the operations illustrated in FIG. 6 in accordance with an example embodiment;

FIG. 10 is a flowchart illustrating operation of a mechanism for scalable arrayout equivalence testing in accordance with an illustrative embodiment;

FIG. 11 depicts pseudo-code for the operations illustrated in FIG. 10 in accordance with an example embodiment;

DETAILED DESCRIPTION

The illustrative embodiments provide a mechanism in a design environment for efficient redundancy identification, redundancy removal, and sequential equivalence checking with designs including memory arrays. The mechanism includes an array merging component to optimally merge an array output such that if the address is out-of-bounds or the port is not asserted, the array output is converted to a random output. The mechanism also includes component for determining the equivalence of enabled array outputs rather than the array outputs directly and creating an enabled array output. The mechanism also includes a component that precludes potentially-redundant array cells from participating in the sequential redundancy removal determination. This component first checks for compatibility of the corresponding arrays, then the corresponding read port enables and addresses, then the corresponding initial values, and finally checking that writes to the corresponding columns yield a compatible set of values.

Figure 1:
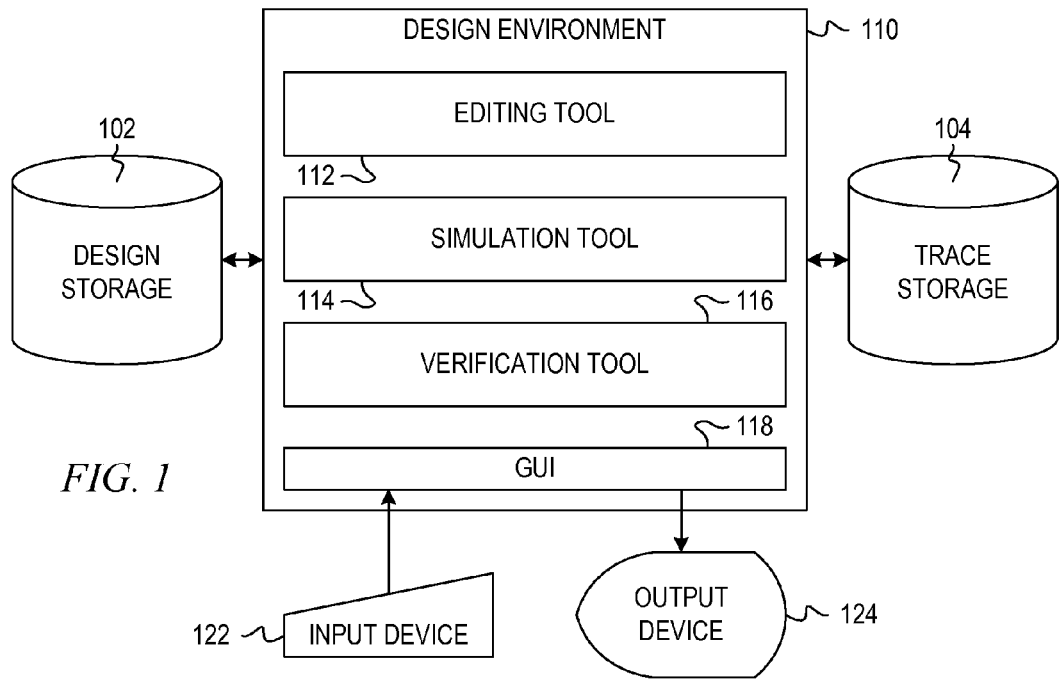
FIG. 1 is a block diagram illustrating an example design environment in accordance with an illustrative embodiment.

FIG. 1 is a block diagram illustrating an example design environment in accordance with an illustrative embodiment. When designing an integrated circuit, a designer may first write a high-level description of the circuit in a hardware description language (HDL), such as Very High-Speed Integrated Circuit (VHSIC) Hardware Description Language (VHDL) or Verilog. In electronics, a hardware description language may be any language from a class of computer languages and/or programming languages for formal description of electronic circuits, and more specifically, digital logic. A HDL can describe the operation of a circuit, its design and organization, and tests to verify its operation by means of simulation. Most designs begin as a set of requirements or a high-level architectural diagram. The designer often prototype control and decision structures in flowchart applications or enter them in a state-diagram editor. The process of writing the HDL description is highly dependent on the nature of the circuit and the designer's preference for coding style.

Design environment 110 may include editing tool 112, simulation tool 114, verification tool 116, and graphical user interface (GUI) 118. A circuit designer may create and edit an integrated circuit (IC) design, which may be written in a high-level HDL, such as VHSIC or Verilog, and store the IC design in design storage 102. The circuit designer may interact with editing tool 112 via graphical user interface (GUI) 118 using input device 122 and output device 124.

Simulation tool 114 simulates operation of an IC circuit from design storage 102. The designer may control simulation tool 114 via GUI 118 using input device 122 and output device 124. Simulation tool 114 stores trace results in trace storage 104. Simulation tool 114 is a primary tool for verifying the logical correctness of a design. In many cases logic simulation is the first activity performed in the process of taking a hardware design from concept to realization. Modern hardware description languages are both simulatable and synthesizable.

Simulation is a natural way for the designer to get feedback about a design. Because simulation tool 114 executes as a program, the designer interacts with the simulation using the vocabulary and abstractions of the design. There is no layer of translation to obscure the behavior of the design. The level of effort required to debug and then verify the design is proportional to the maturity of the design. That is, early in the life of the design, the designer may find bugs and incorrect behavior quickly. Simulation is completely general; any hardware design can be simulated. The only limits are time and computer resources in design environment 110.

Verification tool 116 allows the designer to verify an IC design from design storage 102. A manufacturer may establish and maintain procedures for verifying an IC design. Design verification confirms that the design output meets the design input requirements. Verification tool 116 compares design outputs to design input requirements to determine whether the requirements have been met. The designer may control verification tool 116 via GUI 118 using input device 122 and output device 124. Formal and semiformal verification techniques are powerful tools for the construction of correct logic designs. They have the power to expose even the most probabilistically uncommon scenario that may result in a functional design failure, and ultimately have the power to prove that the design is correct, i.e. that no failing scenario exists.

A netlist contains a directed graph with vertices representing gates and edges representing interconnections between those gates. The gates have associated functions, such as constants, primary inputs (hereafter referred to as RANDOM gates), combinational logic such as AND gates, simple sequential elements (hereafter referred to as registers), and memory arrays. Registers have two associated components: their next-state functions and their initial-value functions. The netlist represents both components as other gates in the graph. Semantically, for a given register, the value appearing at its initial-value gate at time "0" ("initialization" or "reset" time) is applied as the value of the register itself; the value appearing at its next-state function at time "i" is applied to the register itself at time "i+1".

Memory arrays represent two-dimensional grids of registers, referred to as "cells," arranged as rows vs. columns. A circuit reads or writes the contents of memory arrays via dedicated "ports" of three types: read ports, initialization ports, and write ports. Ports of these three types have three components: an address, a data vector, and an enable. The address indicates which row is to be accessed. The enable indicates whether or not the given port is being accessed. The data vector indicates what value is to be written to the given row (if enabled) in the case of a write port or the contents present for the given row of an enabled read. Initialization ports are specialized write ports that are relevant only at time 0.

Memory arrays have a pre-defined number of rows and columns, a default initial value (in case of an unwritten row is read), and an indication of read-before-write vs. write-before read behavior. The latter is relevant in case of a concurrent read and write to the same address: read-before-write will not return the concurrent write data, whereas write-before-read will. The memory array will often conservatively randomize data contents of a read port in case the read enable is not active, or in case the read row is "out-of-bounds," i.e. the read address is larger than the pre-defined number of rows for the array. Read port data pins are the only "outputs" of arrays. All other pins are "inputs." Read port data pins are sometimes referred to as "arrayouts."

Write ports and initialization ports have a pre-defined precedence defining which values will persist in case of multiple concurrent writes or initializations to the same address. Port precedence is irrelevant for read ports; every concurrent read to a given address returns the same data, which is the highest-priority write to the given address in the case of write-before-read, else the highest-priority most recent write to that address if any exist, else the highest-priority initialization to that address if any such initialization ports exist, else the default initial value.

Certain gates in a netlist are labeled as "targets." Targets correlate to the properties one wishes to verify; the goal of the verification process is to find a way to drive a "1" to a target node (and to generate a "trace" illustrating this scenario if one is found), or to prove that no such assertion of the target is possible.

To establish a convention for referring to components of an array, let $R\_1, \ldots, R\_m$ represent the read ports, $W\_1, \ldots, W\_n$ represent the write ports in order of decreasing precedence, and let $I\_1, \ldots, I\_o$ represent the initialization ports in order of decreasing precedence. For a given port $P\_i$, where P may be R, W, or I), let $P\_i$.enable refer to the gate that is connected to the enable pin of that port, $P\_i$.address $(0), \ldots, P\_i$.address$(p)$ represent the gates connected to the address pins of that port with 0 being the most significant bit, and $P\_i$.data$(0), \ldots, P\_i$.data$(q)$ be the gates connected to the data pins of that port. It is possible for some data pins to be disconnected from the ports; for read ports, this means that the corresponding column bit is not relevant to the netlist, whereas for write and initialization ports, this means that the corresponding column bit is not updated by a corresponding write or initialization operation. For a given arrayout $a\_i$, let $a\_i$.array represent the array to which $a\_i$ is associated, let $a\_i$.port represent the port to which that arrayout is connected, and let $a\_i$.column represent the column of the array it samples. In other words, $a\_i$.port.data$(a\_i)$ column=$a\_i$. The write-before-read attribute of an array is referred to as array.type.

A common technique to reduce the size of a netlist is to identify functionally redundant gates, which always evaluate to the same value along any possible trace, then to "merge" those redundant gates. A merge operation between two gates consists of moving all fanout references from one to the other and making the resulting sinkless gate a simple buffer sampling f the value of the other. The benefit of a merge is that it reduces the number of non-buffer gates in the netlist, noting that buffers practically have zero cost to represent in many frameworks being simple "aliases" to the remaining gate.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 2:
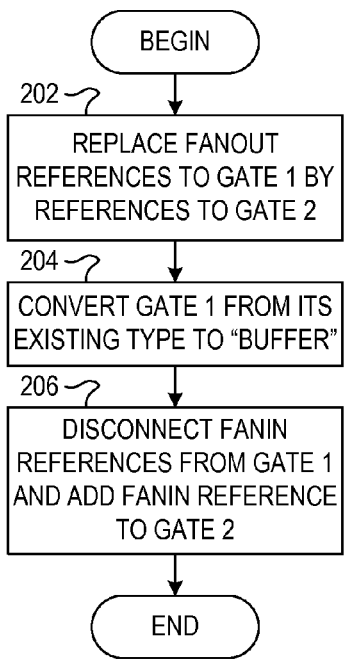
FIG. 2 is a flowchart illustrating operation of a mechanism for performing gate merging in accordance with an illustrative embodiment.

FIG. 2 is a flowchart illustrating operation of a mechanism for performing gate merging in accordance with an illustrative embodiment. Operation begins by receiving a first gate, gate 1, and a second gate, gate 2, and the mechanism replaces fanout references to gate 1 by references to gate 2 (block 202). Then, the mechanism converts gate 1 from its existing type to a "buffer" type (block 204). The mechanism then disconnects the fanin references from gate 1 and adds fanin reference to gate 2 (block 206). Thereafter, operation ends.

FIG. 3 depicts pseudo-code for the operations illustrated in FIG. 2 in accordance with an example embodiment. Merging in the presence of native arrays is generally more complex. Consider a design that includes two equivalent arrays, i.e. there is a one-to-one correspondence of array cells that always contain equivalent data. If each of these arrays has a single read port such that the corresponding read enables and addresses evaluate equivalently, the data produced at the output of their red ports will be equivalent provided that the read ports are enabled and the read addresses are not out-of-bounds. Thus, even in this very simple case of a design with two functionally equivalent arrays, the fact that array outputs must be conservatively modeled as randomized on a per-port basis when disabled or out-of-bounds requires a more intricate "merge" operation to enable the elimination of one of the arrays to account for this randomization. Nonetheless, it is very desirable to merge array outputs, as doing do reduces the number of array cells (state elements) in the resulting design, which often enables dramatic capacity increases in any resulting analysis.

Figure 4:
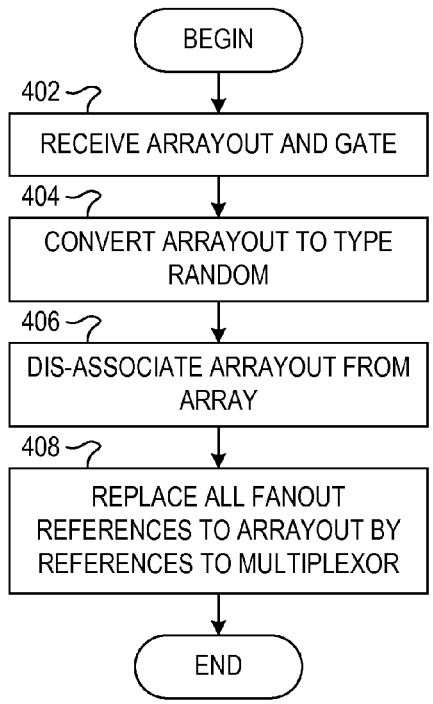
FIG. 4 is a flowchart illustrating operation of a mechanism for optimally merging an array output in accordance with an illustrative embodiment.

FIG. 4 is a flowchart illustrating operation of a mechanism for optimally merging an array output in accordance with an illustrative embodiment. Operation begins, and the mechanism receives an arrayout and a gate (block 402). The mechanism converts the arrayout to type RANDOM (block 404). Then, the mechanism dis-associates the arrayout from the array (block 406). The mechanism then replaces all fanout references to a 1 by references to a multiplexor that selects the arrayout if the address is out-of-bounds or the port is not enabled and otherwise selects the gate (block 408). Thereafter, operation ends.

FIG. 5 depicts pseudo-code for the operations illustrated in FIG. 4 in accordance with an example embodiment. As an additional optimization, if the mechanism determines that "randomized=0" along all traces, then the multiplexor implementation is unnecessary and the pseudo-code of FIG. 4 may be used in place. Determining this condition may be a precondition to using this solution in a synthesis flow, as, for example, the silicon behavior of a RANDOM gate may be meaningless. Alternatively, as the semantics of languages, such as VHDL, are undefined for out-of-bounds accesses, "randomized" may be used as a "don't-care" condition for synthesis. That said, note that synthesis flows are still required to conservatively prove all optimizations that they wish to prefer; hence, the formal reasoning front-end of synthesis flows would generally need to use this modeling. Furthermore, post-synthesis equivalence checking would require this modeling.

Figure 6:
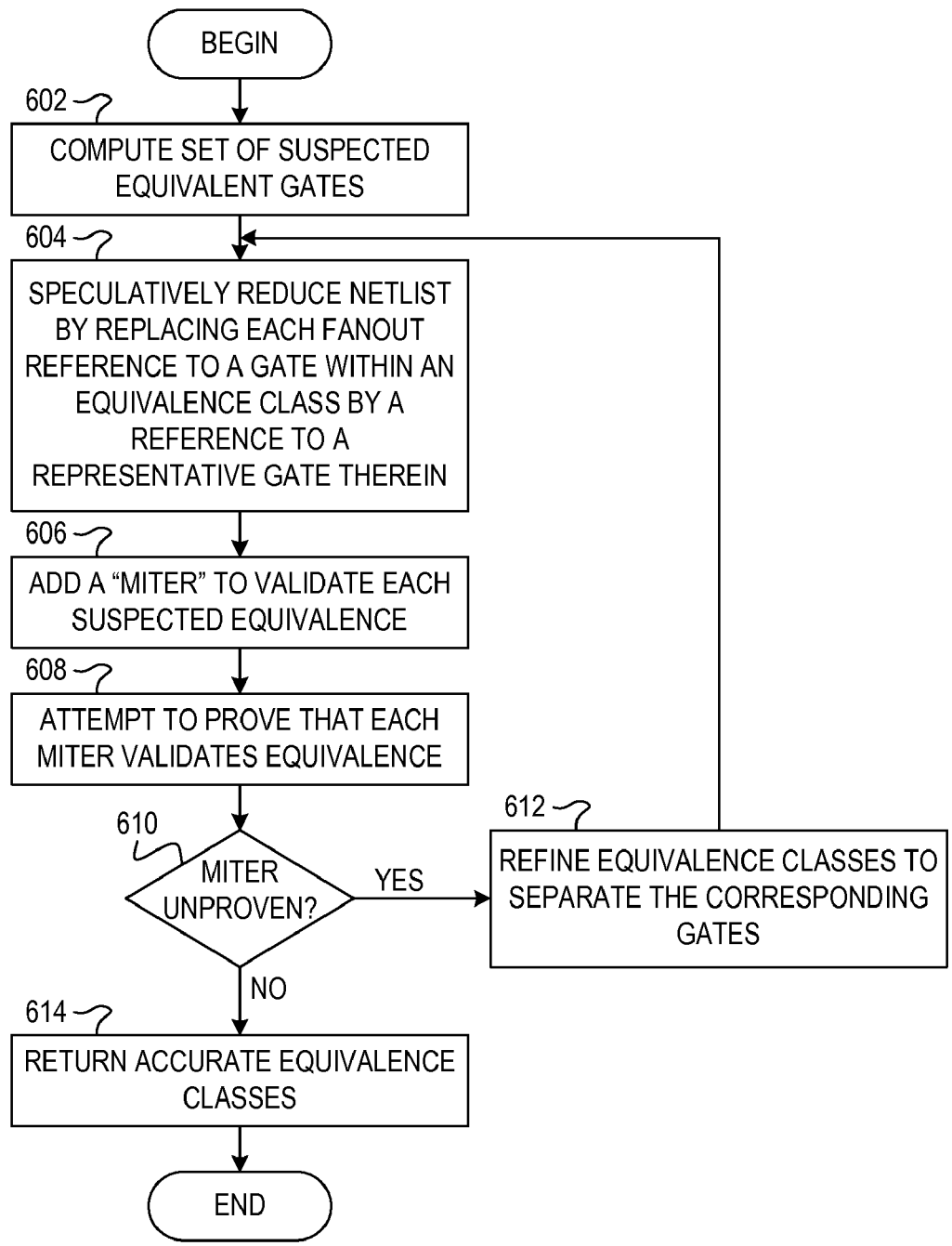
FIG. 6 is a flowchart illustrating operation of a mechanism for redundancy removal in accordance with an illustrative embodiment.

FIG. 6 is a flowchart illustrating operation of a mechanism for redundancy identification in accordance with an illustrative embodiment. Redundancy identification is the process of attempting to identify all functionally equivalent gates in a netlist. Once identified, the mechanism may reduce the size of the corresponding netlist through merging, as described above with respect to FIGS. 2 and 4. Operation begins for a given netlist, N, and the mechanism computes a set of suspected equivalent gates (block 602). The result is a set of equivalent classes, where each pair of gates in an equivalent class is suspected to be functionally equivalent to each other gate in the equivalence class along all possible traces.

Then, the mechanism speculatively reduces the netlist by replacing each fanout reference to a gate within an equivalence class by a reference to a representative gate therein (block 604). The mechanism then adds a "miter" to validate each suspected equivalence (block 606). In an example embodiment, the miter may be an exclusive-OR (XOR) gate between each gate in an equivalence class and its representative gate therein, where the output of the XOR gate will be 0 if the gates generate the same output (equivalent) and 1 if the gates generate different outputs (not equivalent). Then, the mechanism attempts to prove that each miter from block 606 validates equivalence (block 608).

The mechanism determines whether the miter is unproven (block 610). If the miter is unproven, then the mechanism refines the equivalence classes to separate the corresponding gates (block 612), and operation returns to block 604 to redefine the equivalence classes. If the miter is proven in block 610, then the mechanism returns the accurate equivalence classes (block 614), and operation ends.

FIG. 7 depicts pseudo-code for the operations illustrated in FIG. 6 in accordance with an example embodiment. It is noteworthy that merely applying redundancy removal frameworks to netlists with native arrays is suboptimal for several reasons. First, it is generally not the case that such a framework may identify arrayouts as redundant, because as discussed above, arrayouts may differ due to disabled or out-of-bounds reads even if the underlying cells being referenced are redundant. Thus, the above mechanism may result in suboptimal redundancy removal in that there will be no ability to merge arrays.

Furthermore, the lack of ability to merge arrays will render the most scalable proof techniques unable to identify any redundancies in the fanout of the arrays. "Inductive techniques" tend to be quite scalable and, thus, are heavily used in redundancy removal and equivalence checking frameworks. An inductive proof consists of two parts: (1) prove that the properties under consideration hold from times 0 . . . n, where time 0 refers to the initial states, and (2) considering any arbitrary state that adheres to the properties under consideration and whose n−1 successor states also adhere to the properties, prove that the properties also hold in one additional state transition from that arbitrary state. If the latter succeeds, one may conclude that the properties hold in all reachable states.

Induction is only conclusive in redundancy removal and equivalence checking frameworks due to the postulation of suspected equivalent gates. Otherwise, induction tends to be inconclusive because, for example, the logic driving primary outputs being equivalence checked, even for equivalence checks between two identical designs, may start in an arbitrary nonequivalent state. Postulation of internal equivalences ensures that the collective "induction hypothesis" requiring the inductive starting states to adhere to the properties to be proven (in this case, the set of internal as well as output equivalences) helps to ensure a compatible inductive starting state between the two designs being equivalence checked.

This limitation of the inability to merge arrays using the mechanism of FIGS. 6 and 7 constitutes a bottleneck to existing automated equivalence checking frameworks and a substantial sub-optimality to the many frameworks that benefit from redundancy removal. It is noteworthy that for most "correct" designs, randomized values due to disabled or out-of-bound reads cannot propagate beyond a specific small logic boundary beyond the arrayouts. Thus, practically speaking, there is often a great deal of redundancy in equivalence checking frameworks at the fanout of arrays despite these randomized arrayouts, inasmuch as equivalence checking frameworks need to capture the impact of such randomized arrayouts manifesting as a potentially failed equivalence check.

Figures 8, 9:
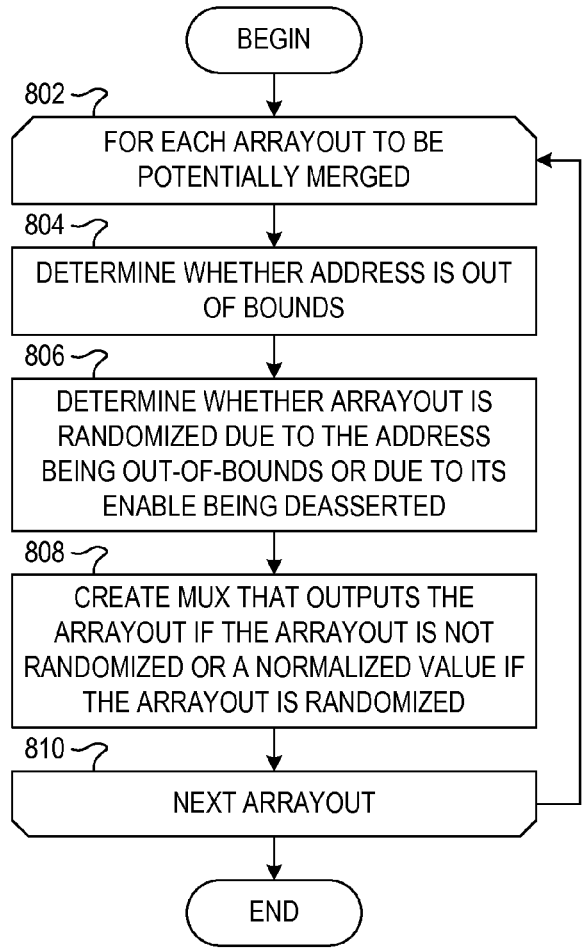
FIG. 8 is a flowchart illustrating operation of a mechanism for enabling arrayout creation in accordance with an illustrative embodiment.
FIG. 9 depicts pseudo-code for the operations illustrated in FIG. 8 in accordance with an example embodiment.

FIG. 8 is a flowchart illustrating operation of a mechanism for enabling arrayout equivalence detection in accordance with an illustrative embodiment. One approach to extending redundancy removal frameworks to netlists with arrays is to postulate the equivalence of "enabled" arrayouts, instead of arrayouts directly. More specifically, one may leverage this mechanism to create a representation of "enabled" arrayouts (mux_i gates), which may be placed in equivalence classes instead of the original arrayouts using a standard sequential equivalence checking flow, as described above with reference to FIGS. 6 and 7. Speculative reduction of arrayouts may be carried out using the operation described above with reference to FIGS. 4 and 5 to simplify miter proofs. The operation shown in FIGS. 4 and 5 may merge any enabled arrayouts that remain in non-singleton equivalence classes.

Now with respect to FIG. 8, operation begins, and for each arrayout to be potentially merged (block 802), the mechanism determines whether the address is out-of-bounds (block 804) and determines whether the arrayout is randomized due to the address being out-of-bounds, as determined in block 804, or due to its enable being deasserted (block 806). Then, the mechanism creates a multiplexor that outputs the arrayout if the arrayout is not randomized or a normalized value if the arrayout is randomized (block 808). Thereafter, the mechanism considers the next arrayout (block 810), and operation returns to block 802 to repeat the loop for the next arrayout. If the mechanism has considered the last arrayout in block 810, then operation ends.

FIG. 9 depicts pseudo-code for the operations illustrated in FIG. 8 in accordance with an example embodiment. In one example embodiment, the normalized gate is a constant value (e.g., constant 0) to reduce the size of the multiplexor. While there may be a large number of arrayouts, the collective size of the multiplexor logic will not be very large: one AND gate per arrayout (assuming normalized value is a constant), and the randomized terms may be shared by all arrayouts associated with a particular read port.

Furthermore, if the mechanism performs the operations described above with reference to FIGS. 6 and 7 exhaustively, i.e. all equivalent gates appear in the same equivalence class (and perhaps even some nonequivalent gates appear in the same equivalence class and will be refined as will be described below), the randomized gates across distinct yet equivalent ports will be expressed by the identical gate, offering more insight into which ports are compatible vs. incompatible, and hence which arrayouts are good/bad candidates to merge.

The operations described in FIGS. 4 and 5 and FIGS. 8 and 9 provide extensions to the sequential redundancy removal frameworks described above with reference to FIGS. 6 and 7 in the presence of arrays. However, it is noteworthy that these extensions are quite suboptimal in that all array cells and arrayouts are still part of the core proof. As discussed above, the presence of distinct arrayouts and array cells renders inductive techniques far from scalable and results in a very large problem representation.

FIG. 10 is a flowchart illustrating operation of a mechanism for scalable arrayout equivalence testing in accordance with an illustrative embodiment. This mechanism precludes potentially redundant array cells from participating in the sequential redundancy removal proof, moving proof obligations to the input vs. output of the arrays. Operation begins, and the mechanism receives a first arrayout and a second arrayout that are potentially redundant (block 1002). The mechanism determines whether the array types are equal (block 1004). That is, the mechanism determines whether the arrays are both read-before-write or both write-before-read. If the array types are not equal, the mechanism returns a result of false, meaning that the two arrayouts are not equivalent (block 1006). Thereafter, operation ends.

If the mechanism determines that the array types are equal in block 1004, the mechanism determines whether the arrayouts have incompatible or randomized default values (block 1008). That is, the mechanism determines whether the arrayouts (a_i.array and a_j.array) have incompatible default initial values with respect to a_i.column and a_j.column, respectively, or if the default value is "randomized." If the arrayouts have incompatible or randomized default values, the mechanism returns a result of false (block 1006), and operation ends.

If the mechanism determines that the arrayouts do not have incompatible or randomized default values in block 1008, the mechanism determines whether the enable pins of the read ports are not equal or the addresses are not equal (block 1010). If the mechanism determines that the enables or addresses are not equal, then the mechanism returns a result of false (block 1006), and operation ends.

If the mechanism determines that the enable pins of the read ports are equal and the addresses are equal in block 1010, then the mechanism generates obligation lists for the initialization ports (block 1012). Then, the mechanism determines whether the obligation lists are compatible (block 1014). If the mechanism determines that the obligation lists for the initialization ports are not compatible, then the mechanism returns a result of false (block 1006), and operation ends.

If the mechanism determines that the obligation lists for the initialization ports are compatible in block 1014, then the mechanism generates obligation lists for the write ports (block 1016). Then, the mechanism determines whether the obligation lists are compatible (block 1018). If the obligation lists for the write ports are not compatible, then the mechanism returns a result of false (block 1006), and operation ends. If the mechanism determines that the obligation lists for the write ports are compatible in block 1018, then the mechanism returns a result of true (block 1020), and operation ends.

FIG. 11 depicts pseudo-code for the operations illustrated in FIG. 10 in accordance with an example embodiment. The goal of this mechanism is to enable scalable proofs of all miters. This mechanism moves the proof obligation from the arrayouts themselves to the inputs to the arrays. The mechanism accomplishes this by checking for compatibility of the corresponding arrays, then corresponding read port enables and addresses, then corresponding initial values, and finally that writes to the corresponding columns yield a compatible set of values. The formation of the latter check, using obligation lists, may become of quadratic complexity with respect to the number of initialization ports or write ports on the corresponding arrays. Practically, many arrays have few ports (often one or two), and the array simplification techniques described herein further reduce this number. Occasionally, it is desired to merge two arrayouts from the same array, which trivializes most of the compatibility checks. Thus, quadratic analysis is often practically inexpensive.

Furthermore, if the equivalence classes are exact or overapproximate, the mechanism may perform much of the check of compatible obligation lists using direct gate comparisons; hence, merely by sorting the two lists and performing direct comparisons, this check often becomes linear-time. In the most general sense, the mechanism may perform all tests of equality or inequality using an arbitrary proof technique, e.g., induction.

Note further that the mechanism must only compute obligation lists once per array, per column, for initialization and write ports. Furthermore, the mechanism must perform the analysis of address equality only once per array. The resulting lists may be reused across all corresponding ports and arrayouts. It is also possible to reduce resources by forcing a one-to-one ordered comparison vs. arbitrary ordering of the ports at the cost of potentially failing to identify some redundancies that truly hold. In one example embodiment, the mechanism attempts an identically ordered comparison first as that often does hold, and then reverts to an exhaustive matching comparison.

In the case that one wishes to prove an arrayout equivalent to a constant, instead of checking for compatibility of initialization and write ports, as in FIGS. 10 and 11, the mechanism may alternatively check that the gate to be merged to is equivalent to the default initial value and that every enabled initialization and write port will only write the given constant to the corresponding arrayout column.

In addition, merging of arrayout a_i onto a_j, which retains a_i, needs only to ensure that when a_j is enabled and in-bounds, a_i is also enabled and has the same address. Thus, the mechanism must relax compatibility checks of FIGS. 10 and 11 accordingly to flag compatibility when a_i.port.enable implies a_j.port.enable and ((a_i.port.address(0 to p)=a_j.port.address(0 to p)) OR (a_j.port.address(0 to p) is out-of-bounds)).

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 12:
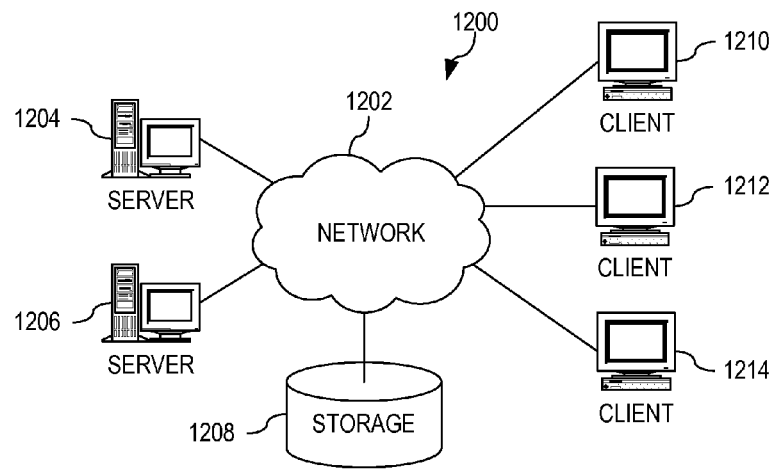
FIG. 12 depicts a pictorial representation of an example distributed data processing system in which aspects of the illustrative embodiments may be implemented.
Figure 13:
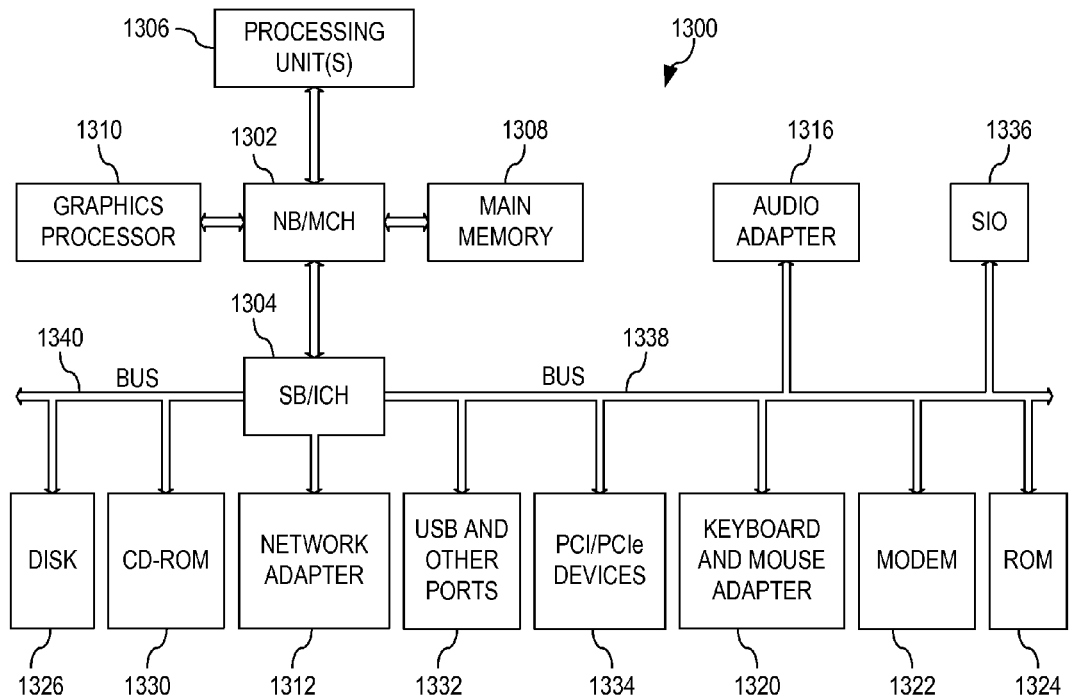
FIG. 13 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 12 and 13 are provided hereafter as example environments in which aspects of the illustrative embodiments may be implemented. While the description following FIGS. 12 and 13 will focus primarily on a single data processing device implementation, this is only an example and is not intended to state or imply any limitation with regard to the features of the present invention. To the contrary, the illustrative embodiments are intended to include distributed data processing environments and embodiments.

With reference now to the figures and in particular with reference to FIGS. 12 and 13, example diagrams of data processing environments are provided in which illustrative embodiments of the present invention may be implemented. It should be appreciated that FIGS. 12 and 13 are only examples and are not intended to assert or imply any limitation with regard to the environments in which aspects or embodiments of the present invention may be implemented. Many modifications to the depicted environments may be made without departing from the spirit and scope of the present invention.

FIG. 12 depicts a pictorial representation of an example distributed data processing system in which aspects of the illustrative embodiments may be implemented. Distributed data processing system 1200 may include a network of computers in which aspects of the illustrative embodiments may be implemented. The distributed data processing system 1200 contains at least one network 1202, which is the medium used to provide communication links between various devices and computers connected together within distributed data processing system 1200. The network 1202 may include connections, such as wire, wireless communication links, or fiber optic cables.

In the depicted example, server 1204 and server 1206 are connected to network 1202 along with storage unit 1208. In addition, clients 1210, 1212, and 1214 are also connected to network 1202. These clients 1210, 1212, and 1214 may be, for example, personal computers, network computers, or the like. In the depicted example, server 1204 provides data, such as boot files, operating system images, and applications to the clients 1210, 1212, and 1214. Clients 1210, 1212, and 1214 are clients to server 1204 in the depicted example. Distributed data processing system 1200 may include additional servers, clients, and other devices not shown.

In the depicted example, distributed data processing system 1200 is the Internet with network 1202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 1200 may also be implemented to include a number of different types of networks, such as for example, an intranet, a local area network (LAN), a wide area network (WAN), or the like. As stated above, FIG. 12 is intended as an example, not as an architectural limitation for different embodiments of the present invention, and therefore, the particular elements shown in FIG. 12 should not be considered limiting with regard to the environments in which the illustrative embodiments of the present invention may be implemented.

With reference now to FIG. 13, a block diagram of an example data processing system is shown in which aspects of the illustrative embodiments may be implemented. Data processing system 1300 is an example of a computer, such as client 1210 in FIG. 12, in which computer usable code or instructions implementing the processes for illustrative embodiments of the present invention may be located.

In the depicted example, data processing system 1300 employs a hub architecture including north bridge and memory controller hub (NB/MCH) 1302 and south bridge and input/output (I/O) controller hub (SB/ICH) 1304. Processing unit 1306, main memory 1308, and graphics processor 1310 are connected to NB/MCH 1302. Graphics processor 1310 may be connected to NB/MCH 1302 through an accelerated graphics port (AGP).

In the depicted example, local area network (LAN) adapter 1312 connects to SB/ICH 1304. Audio adapter 1316, keyboard and mouse adapter 1320, modem 1322, read only memory (ROM) 1324, hard disk drive (HDD) 1326, CD-ROM drive 1330, universal serial bus (USB) ports and other communication ports 1332, and PCI/PCIe devices 1334 connect to SB/ICH 1304 through bus 1338 and bus 1340. PCI/PCIe devices may include, for example, Ethernet adapters, add-in cards, and PC cards for notebook computers. PCI uses a card bus controller, while PCIe does not. ROM 1324 may be, for example, a flash basic input/output system (BIOS).

HDD 1326 and CD-ROM drive 1330 connect to SB/ICH 1304 through bus 1340. HDD 1326 and CD-ROM drive 1330 may use, for example, an integrated drive electronics (IDE) or serial advanced technology attachment (SATA) interface. Super I/O (SIO) device 1336 may be connected to SB/ICH 1304.

An operating system runs on processing unit 1306. The operating system coordinates and provides control of various components within the data processing system 1300 in FIG. 13. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 1300 (Java is a trademark of Sun Microsystems, Inc. in the United States, other countries, or both).

As a server, data processing system 1300 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 1300 may be a symmetric multiprocessor (SMP) system including a plurality of processors in processing unit 1306. Alternatively, a single processor system may be employed.

Instructions for the operating system, the object-oriented programming system, and applications or programs are located on storage devices, such as HDD 1326, and may be loaded into main memory 1308 for execution by processing unit 1306. The processes for illustrative embodiments of the present invention may be performed by processing unit 1306 using computer usable program code, which may be located in a memory such as, for example, main memory 1308, ROM 1324, or in one or more peripheral devices 1326 and 1330, for example.

A bus system, such as bus 1338 or bus 1340 as shown in FIG. 13, may be comprised of one or more buses. Of course, the bus system may be implemented using any type of communication fabric or architecture that provides for a transfer of data between different components or devices attached to the fabric or architecture. A communication unit, such as modem 1322 or network adapter 1312 of FIG. 13, may include one or more devices used to transmit and receive data. A memory may be, for example, main memory 1308, ROM 1324, or a cache such as found in NB/MCH 1302 in FIG. 13.

Those of ordinary skill in the art will appreciate that the hardware in FIGS. 12 and 13 may vary depending on the implementation. Other internal hardware or peripheral devices, such as flash memory, equivalent non-volatile memory, or optical disk drives and the like, may be used in addition to or in place of the hardware depicted in FIGS. 12 and 13. Also, the processes of the illustrative embodiments may be applied to a multiprocessor data processing system, other than the SMP system mentioned previously, without departing from the spirit and scope of the present invention.

Moreover, the data processing system 1300 may take the form of any of a number of different data processing systems including client computing devices, server computing devices, a tablet computer, laptop computer, telephone or other communication device, a personal digital assistant (PDA), or the like. In some illustrative examples, data processing system 1300 may be a portable computing device which is configured with flash memory to provide non-volatile memory for storing operating system files and/or user-generated data, for example. Essentially, data processing system 1300 may be any known or later developed data processing system without architectural limitation.

Thus, the illustrative embodiments provide mechanisms in a design environment for efficient redundancy identification, redundancy removal, and sequential equivalence checking with designs including memory arrays. The mechanism includes an array merging component to optimally merge an array output such that if the address is out-of-bounds or the port is not asserted, the array output is converted to a random output. The mechanism also includes component for determining the equivalence of enabled array outputs rather than the array outputs directly and creating an enabled array output. The mechanism also includes a component that precludes potentially-redundant array cells from participating in the sequential redundancy removal determination. This component first checks for compatibility of the corresponding arrays, then the corresponding read port enables and addresses, then the corresponding initial values, and finally checking that writes to the corresponding columns yield a compatible set of values.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for performing redundancy removal in an integrated circuit design with a memory array, the method comprising:
   receiving, by the data processing system, a netlist for an integrated circuit design, wherein the netlist comprises a memory array having one or more arrayouts;
   determining, by the data processing system, an equivalent class comprising a set of suspected equivalent gates, wherein the set of suspected equivalent gates comprises a plurality of arrayouts;
   determining, by the data processing system, whether a first arrayout and a second gate in the equivalence class are equivalent; and
   responsive to the first arrayout and the second gate being equivalent, merging, by the data processing system, the first arrayout and the second gate.

2. The method of claim 1, further comprising:
   responsive to determining the equivalence class, speculatively reducing the netlist by replacing each fanout reference to a gate within the equivalence class with a reference to a representative gate in the equivalence class.

3. The method of claim 1, wherein determining whether the first arrayout and the second gate are equivalent comprises:
   adding a miter between the first arrayout and the second gate; and
   determining whether the miter validates equivalence.

4. The method of claim 3, wherein the miter is an exclusive-OR gate.

5. The method of claim 1, further comprising:
   responsive to the first arrayout and the second gate not being equivalent, refining the equivalence class to separate the first arrayout and the second gate.

6. The method of claim 1, wherein merging the first arrayout and the second gate comprises:
   determining whether the arrayout is randomized due to its address being out-of-bounds or its enable not being asserted;
   converting the arrayout from an arrayout type to a random type gate and dis-associating the arrayout from its array;
   creating a multiplexor structure, wherein the multiplexor structure selects the arrayout if the arrayout is randomized and selects the second gate if the arrayout is not randomized; and
   replacing all fanout references to the arrayout with references to the multiplexor structure.

7. The method of claim 1, wherein determining an equivalent class comprises:
   determining whether the arrayout is randomized due to its address being out-of-bounds or its enable not being asserted;
   creating a multiplexor structure, wherein the multiplexor structure selects the arrayout if the arrayout is not randomized and selects a normalized value if the arrayout is randomized; and
   replacing the arrayout with the multiplexor structure in the equivalence class.

8. The method of claim 1, wherein the second gate is a second arrayout and wherein determining whether a first arrayout and a second arrayout are equivalent comprises:
   responsive to the first arrayout and the second arrayout not being of the same type, determining that the first arrayout and the second arrayout are not equivalent.

9. The method of claim 1, wherein the second gate is a second arrayout and wherein determining whether a first arrayout and a second arrayout are equivalent comprises:
   responsive to the first arrayout and the second arrayout having incompatible default initial values or randomized default initial values, determining that the first arrayout and the second arrayout are not equivalent.

10. The method of claim 1, wherein the second gate is a second arrayout and wherein determining whether a first arrayout and a second arrayout are equivalent comprises:
    responsive to the first arrayout and the second arrayout having unequal enables or addresses, determining that the first arrayout and the second arrayout are not equivalent.

11. The method of claim 1, wherein the second gate is a second arrayout and wherein determining whether a first arrayout and a second arrayout are equivalent comprises:
    generating a first obligation list for initialization ports of the first arrayout;
    generating a second obligation list for initialization ports of the second arrayout; and
    responsive to the first obligation list and the second obligation list not being compatible, determining that the first arrayout and the second arrayout are not equivalent.

12. The method of claim 1, wherein the second gate is a second arrayout and wherein determining whether a first arrayout and a second arrayout are equivalent comprises:
    generating a first obligation list for write ports of the first arrayout;
    generating a second obligation list for write ports of the second arrayout; and
    responsive to the first obligation list and the second obligation list not being compatible, determining that the first arrayout and the second arrayout are not equivalent.

13. A computer program product comprising a computer readable storage medium having a computer readable program stored therein, wherein the computer readable program, when executed on a computing device, causes the computing device to:
    receive, by the computing device, a netlist for an integrated circuit design, wherein the netlist comprises a memory array having one or more arrayouts;

determine, by the computing device, an equivalent class comprising a set of suspected equivalent gates, wherein the set of suspected equivalent gates comprises a plurality of arrayouts;

determine, by the computing device, whether a first arrayout and a second gate in the equivalence class are equivalent; and responsive to the first arrayout and the second gate being equivalent, merge, by the computing device, the first arrayout and the second gate.

14. The computer program product of claim 13, further comprising:

responsive to determining the equivalence class, speculatively reducing the netlist by replacing each fanout reference to a gate within the equivalence class with a reference to a representative gate in the equivalence class.

15. The computer program product of claim 13, wherein merging the first arrayout and the second gate comprises:

determining whether the arrayout is randomized due to its address being out-of-bounds or its enable not being asserted;

converting the arrayout from an arrayout type to a random type gate and dis-associating the arrayout from its array;

creating a multiplexor structure, wherein the multiplexor structure selects the arrayout if the arrayout is randomized and selects the second gate if the arrayout is not randomized; and replacing all fanout references to the arrayout with references to the multiplexor structure.

16. The computer program product of claim 13, wherein determining an equivalent class comprises:

determining whether the arrayout is randomized due to its address being out-of-bounds or its enable not being asserted;

creating a multiplexor structure, wherein the multiplexor structure selects the arrayout if the arrayout is not randomized and selects a normalized value if the arrayout is randomized; and replacing the arrayout with the multiplexor structure in the equivalence class.

17. The computer program product of claim 13, wherein the second gate is a second arrayout and wherein determining whether a first arrayout and a second arrayout are equivalent comprises:

responsive to the first arrayout and the second arrayout not being of the same type, determining that the first arrayout and the second arrayout are not equivalent;

responsive to the first arrayout and the second arrayout having incompatible default initial values or randomized default initial values, determining that the first arrayout and the second arrayout are not equivalent;

responsive to the first arrayout and the second arrayout having unequal enables or addresses, determining that the first arrayout and the second arrayout are not equivalent;

generating a first obligation list for initialization ports of the first arrayout;

generating a second obligation list for initialization ports of the second arrayout; and responsive to the first obligation list and the second obligation list not being compatible, determining that the first arrayout and the second arrayout are not equivalent.

18. The computer program product of claim 13, wherein the computer readable program is stored in a computer readable storage medium in a data processing system and wherein the computer readable program was downloaded over a network from a remote data processing system.

19. The computer program product of claim 13, wherein the computer readable program is stored in a computer readable storage medium in a server data processing system and wherein the computer readable program is downloaded over a network to a remote data processing system for use in a computer readable storage medium with the remote system.

20. An apparatus, comprising:

a processor; and a memory coupled to the processor, wherein the memory comprises instructions which, when executed by the processor, cause the processor to:

receive a netlist for an integrated circuit design, wherein the netlist comprises a memory array having one or more arrayouts;

determine an equivalent class comprising a set of suspected equivalent gates, wherein the set of suspected equivalent gates comprises a plurality of arrayouts;

determine whether a first arrayout and a second gate in the equivalence class are equivalent; and responsive to the first arrayout and the second gate being equivalent, merge the first arrayout and the second gate.

* * * * *